(12) United States Patent
Haerle et al.

(10) Patent No.: US 6,881,262 B1
(45) Date of Patent: Apr. 19, 2005

(54) METHODS FOR FORMING HIGH PURITY COMPONENTS AND COMPONENTS FORMED THEREBY

(75) Inventors: Andrew G. Haerle, Sutton, MA (US); Han C. Chang, Hsin-Chu (TW)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 121 days.

(21) Appl. No.: 10/328,251

(22) Filed: Dec. 23, 2002

(51) Int. Cl.[7] .................. C30B 25/04; C30B 25/12
(52) U.S. Cl. ........................ 117/103; 117/105
(58) Field of Search .................. 117/103, 105; 427/249, 255.1, 255.2

(56) References Cited

U.S. PATENT DOCUMENTS

| 3,951,587 A | 4/1976 | Alliegro et al. |
| 4,982,068 A | 1/1991 | Pollock et al. |
| 4,998,879 A | 3/1991 | Foster et al. |
| 5,194,330 A | 3/1993 | Vandenbulcke et al. |
| 5,738,908 A | 4/1998 | Rey et al. |
| 5,846,611 A | 12/1998 | Christin |
| 6,162,543 A | 12/2000 | Dubots et al. |
| 6,383,298 B1 | 5/2002 | Ross et al. |
| 6,410,088 B1 | 6/2002 | Robin-Brosse et al. |

*Primary Examiner*—Felisa Hiteshew
(74) *Attorney, Agent, or Firm*—Toler, Larson & Abel, LLP; Thomas G. Field, III

(57) ABSTRACT

A method of forming a component is disclosed. The method includes: providing a core containing a porous material; infiltrating the core with silicon carbide; and removing the porous material of the core, thereby forming a porous substrate containing silicon carbide.

35 Claims, 1 Drawing Sheet

METHODS FOR FORMING HIGH PURITY COMPONENTS AND COMPONENTS FORMED THEREBY

CROSS-REFERENCE TO RELATED APPLICATION(S)

BACKGROUND

1. Field of the Invention

The present invention is related generally to a method for form ing a component by a subtractive process wherein a porous core is removed for later stage processing. In addition, the present invention is related to such components which find use in semiconductor processing and which require ultra high purity.

2. Description of the Related Art

In the semiconductor industry, device geometries of active components continue to be reduced. Presently, semiconductor devices are being produced having transistor critical dimensions well below one micron, such as less than 0.25 microns. As device geometries continue to shrink, manufacturers of logic as well as memory devices continue to place increasing demands on suppliers of semiconductor process ing equipment to achieve previously unsurpassed purity levels. Semiconductor processing components include components such as wafer paddles, process tubes, wafer boats, liners, pedestals, long boats, cantilever rods, wafer carriers, and vertical process chambers, and the like. Conventionally, such components have been made of fused silica (quartz), which material has served the semiconductor processing community well. However, the desire for improved thermal conductivity and high temperature strength, has spurred development of certain processing components based on other materials, such as silicon carbide.

Conventionally, silicon carbide and siliconized silicon carbide components have relied upon powder processing techniques for fabrication. Use of the powder pathway inherently introduces impurities which are largely unacceptable to the semiconductor processing community. Such impurities typically include iron, aluminum, titanium, vanadium, etc. One conventional technique to address such impurities, is to utilize a high purity CVD coating to seal impurities into the bulk material. However, such a technique has numerous drawbacks. For example, if the CVD coating does not achieve complete coverage, has a defect, or chips or cracks, impurities in the bulk material are free to diffuse into the processing environment, and/or the semiconductor wafers. An example of forming a silicon carbide component by powder processing techniques, followed by silicon impregnation, is shown in U.S. Pat. No. 3,951,587.

To address such drawbacks, formation of highly pure silicon carbide components completely in the gas phase by chemical vapor deposition (CVD) techniques has been investigated. However, such processing is lime consuming, expensive, and limited to simple geometry such as disks, plates and cylinders. Accordingly, standalone CVD silicon carbide components, while achieving desirable impurity levels, are not a viable method for complex shaped silicon carbide components.

Another technique for forming silicon carbide based components involves use of a high purity graphite body, which is converted to silicon carbide by exposure to a silicon containing gas. Background material on this type of processing is described in U.S. Pat. No. 6,162,543. In this technique, a high purity graphite body is exposed to SiO gas under conditions which allow replacement of carbon atoms with silicon atoms to form a stoichiometric beta-silicon carbide body. Generally, such products are then siliconized by impregnation with liquid silicon to form a dense body. While the development of high purity silicon carbide based semiconductor processing components continues to evolve to meet semiconductor manufacturing demands, the need continues to exist in the art for improved semiconductor processing components, and in particular processing technologies for forming such components.

SUMMARY

According to one aspect of the invention, a method of forming a component is provided. The method includes: providing a core containing a porous material; infiltrating the core with silicon carbide; and removing the porous material of the core, thereby forming a porous substrate containing silicon carbide.

According to another aspect of the invention, a method of forming a component is provided. The method calls for providing a porous core having an open porous structure of interconnected pores; infiltrating the core with an infiltrant such that infiltrant penetrates the open porous structure, such that a material is deposited therein; and removing the porous material of the core, thereby forming a porous substrate formed mainly of the material.

According to another aspect of the invention, a method of forming a component is provided. The method calls for providing a core comprised of a porous material; infiltrating the core with a first infiltrant; removing the porous material of the core, thereby forming a porous substrate formed mainly of the first infiltrant; infiltrating the porous substrate with a second infiltrant to reduce porosity of the porous substrate.

According to another aspect of the invention, a method of processing a semiconductor wafer is provided, including: providing a semiconductor processing component formed by infiltrating silicon carbide into a core formed of a porous material, removing the porous material of the core to form a porous substrate, and infiltrating the porous substrate with at least one of silicon and silicon carbide to reduce a porosity of the porous substrate; and subjecting at least one semiconductor wafer to a processing operation utilizing the semiconductor processing component.

According to another aspect of the invention, a method of forming a component is provided. The method calls for providing a substrate assembly having a porous core which forms a matrix defining internal passageways, and an infiltrant material coating the internal passageways of the core; and removing the core leaving behind a porous substrate comprising the infiltrant material.

Another aspect of the present invention calls for a semiconductor processing component formed by the foregoing techniques.

Figure 1:
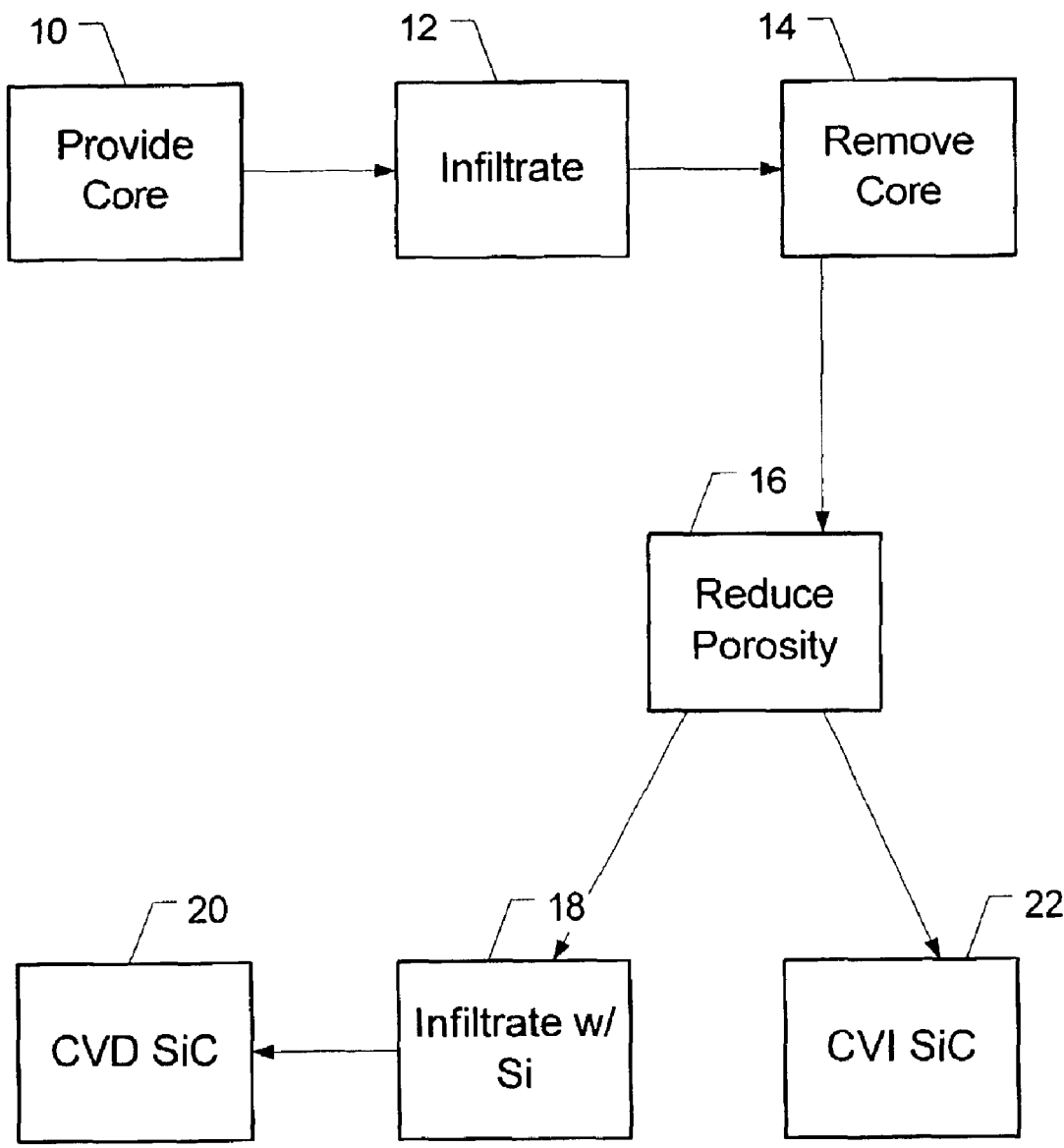
FIG. 1 is a flow diagram illustrating a general process flow according to an embodiment of the invention.

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Processing of a component, and particularly a semiconductor processing component, begins with the provision of a core as shown in step 10 in FIG. 1. The core is generally formed of any one of several porous materials which can be removed during later stage processing, such as by heat treatment in various environments, such as oxidizing or reducing environments, or by liquid phase dissolution. According to one embodiment, the core is formed of a porous graphite (carbon) material.

Use of a porous graphite core is particularly desirable, as high purity graphite bulk materials may be sourced from various commercial suppliers. Such bulk material may have a density within a wide range, such as from 0.04 to about 2.0 g/cm$^3$, corresponding to 97% to about 10% porosity. However, desirably, the porosity of the bulk material forming the core is greater than 50%, and more desirably, greater than 65%. Sufficiently high porosity helps ensure that an interconnected network of pores is present within the core to support later stage processing steps. This interconnected network of pores or passageways is defined by a matrix forming the core that is sufficiently porous. The average pore size of the material may also vary within a wide range, such as about 10 microns to about 1000 microns. Typically, the average pore size is within a range of about 20 to 500 microns. The average pore size is chosen such that the interconnected network of pores is of sufficient diameter for later stage processing, and in particular, infiltration as described in more detail herein.

The carbon bulk material of the core desirably has a very low impurity content, in line with expected impurity levels suitable for semiconductor processing. Typically, the impurity level has less than about 100 ppm total, more desirably less than about 20 ppm total.

Typically, the bulk material is then machined into the desired component geometry to form the core. Alternatively, the desired component geometry can be machined after the first infiltration process. The core is then infiltrated with a desired material as shown in FIG. 1 as step 12. The infiltration may be carried out by any one of several pathways. For example, a liquid phase or gas phase process may be carried out. In this regard, typically the body is penetrated or infiltrated by gas phase or liquid phase reactants, which react and deposit a material within the porous network of the core. In this regard, it is desired that the reactants penetrate a substantial portion of the body, and preferably penetrate the entire interconnected network of pores while the desired reaction takes place to form the deposited material.

In one example, the reactants are in the gas phase such that infiltration is carried out by chemical vapor infiltration (CVI). CVI differs from chemical vapor deposition (CVD) on various points. Most notably, the reaction kinetics and diffusion kinetics of the reactants are managed such that the reactants penetrate the core and deposit material therein, rather than the rather quick reaction normally associated with CVD to form a surface layer. Alternatively stated, the reaction speed during CVI is slowed to permit infiltration prior to substantial onset of reaction and deposition. In the case of depositing silicon carbide, the reactants include a silicon source and a carbon source. The silicon source and carbon source may be provided in the same or different gaseous reactants. For example, methyltrichlorosilane (MTS), which contains silicon and carbon, may be flowed together with a second reactant gas, hydrogen (H$_2$). The reaction that takes place is illustrated below, in which the deposited material is silicon carbide which is formed by the decomposition of MTS in the presence of hydrogen which acts as a reducing agent:

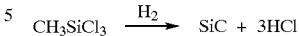

$$CH_3SiCl_3 \xrightarrow{H_2} SiC + 3HCl$$

In this particular embodiment, the processing conditions to carry out infiltration are adjusted so as to desirably control the diffusion kinetics of the gaseous reactants diffusing into the porous core, relative to the reaction speed to form silicon carbide. In particular, the temperature, pressure (importantly, the partial pressure of each of the reactants) as well as the flow rates and infiltration time period, are adjusted to enable diffusion at a rate to minimize the onset of deposition along an outer surface of the core, which undesirably can clog the pores and form an effective diffusion barrier. Specific processing parameter and techniques are described in U.S. Pat. No. 5,738,809, incorporated herein by reference.

Typically, relevant process conditions for forming silicon carbide through the decomposition of MTS as described above call for a pressure within a range of about 5 to about 500 torr, a temperature within a range of about 850° C. to about 1200° C., an H$_2$:MTS ratio within a range of about 1:1 to about 20:1, and in infiltration time period within a range of about 10 to about 300 hours. More specific processing conditions include about 10 to about 300 torr, about 900 to about 1100° C., H$_2$: MTS ratio within a range of about 2:1 to about 10:1.

Depending on the reaction kinetics, the complexity and dimensions of the component being infiltrated, average pore size and porosity of the core, and other processing conditions, infiltrating may be carried out in several sub steps, in which infiltration is ceased, and one or more outer surfaces of the core is machined to remove any build-up of deposited material along outer surfaces of the core. This step may desirably re-open the clogged pores along an outer surface of the core. Following machining, infiltrating may be continued as desired.

Following infiltration, the core is removed, shown as step 14 in FIG. 1. As noted above, the core may be removed by one of various techniques, including by dissolution by utilizing an appropriate aqueous solvent, gas phase or liquid-phase reduction or oxidation, as well as any other chemical reactions which are effective to react with and remove the core material. In the case of utilizing a carbon graphite core as described above, the core may be advantageously removed by volatilization, namely, high temperature oxidation. In this regard, to aid in removal of the core, at least one outer surface of the infiltrated core may be machined, so as to expose at least a portion of the core to the exterior environment. The core is then generally placed in a furnace in an oxidizing environment, such as air, and heated to an elevated temperature to oxidize and remove the core. Suitable temperatures may be greater than 600° C., and nominal temperatures within a range of 600° C. to about 900° C. While specific embodiments call for core removal at lowered pressures, such as on the order of 0.1 to 10 torr, core removal by oxidation may be carried out higher pressures, such as atmospheric pressure.

Core removal is typically carried out during a time period sufficient to substantially totally remove the core material. This time may be on the order of about 10 minutes to on the order of 10 to 20 hours, typically 0.5 to 5 hours. It is generally desired to remove as much of the core material as possible. Particular embodiments of the invention have achieved substantially complete core removal, leaving behind less than 2 wt. % of carbon, most typically less than about 1 wt. %. Particular embodiments have been measured to have a residual carbon content in the ppm range, such as less that about 500 ppm. Examples have been measured to have a residual carbon content on the order of 1 to 200 ppm, such as about 10 to 100 ppm.

By removal of the core, an article is thereby formed which contains mainly the material deposited by the infiltrating procedure, such as silicon carbide according to an embodiment of the present invention as discussed above. The article formed as a result of the core removal is generally referred to herein as a porous substrate.

Following infiltration and removal of the core, the porous substrate may be further processed, depending upon the particular end use of the component. In the case of semiconductor processing components, it is generally desirable to reduce the overall porosity of the component. Accordingly, as shown in FIG. 1, following removal of the core in step 14, porosity is reduced by step 16. Porosity reduction may be carried out by various techniques. For example, the porous substrate may be infiltrated with molten silicon. This process is understood in the art and sometimes described as siliconization. In reference to FIG. 1, siliconization is a species of porosity reduction and is shown as step 18. Here, typically the porous substrate is contacted with molten silicon at an elevated temperature. Due to the porosity of the substrate, and wetting and surface tension characteristics of the molten silicon, the molten silicon is drawn into the porous substrate by capillary action. More particularly, the molten silicon is drawn into the interconnected network of pores formed by the matrix of the porous substrate by capillary action or "wicking." In its simplest form, the component may be placed in a crucible or other refractory container along with chunks or a powdered form of semiconductor grade silicon. Upon heating to an elevated temperature above the melting point of the silicon, the silicon is melted to effect siliconization.

In the case of semiconductor processing components, it is of course desirable to limit the impurity levels in the silicon. In this regard, the purity of the silicon is ensured by sourcing the silicon raw material from a suitable commercial producer specifically for semiconductor processing. Because the raw material is melted, the silicon may be in single crystal form or polycrystalline form. Typical processing temperatures during siliconization range from about 1400° C. to about 2100° C. More typical temperatures range from about 1750° C. to about 2000° C. The duration of siliconization is carried out for a time period sufficient to ensure substantially complete saturation of the porous substrate with the molten silicon, and typical times range within 10 minutes to 10 hours. While embodiments of the present invention have been carried out at reduced pressures, such as on the order of 0.1 torr to about 100 toff, siliconization may be carried out at higher pressures, such as at atmospheric pressure and higher.

Depending upon the particular semiconductor processing component being siliconized, optionally the component may be further treated by coating with silicon carbide, such as by chemical vapor deposition (CVD), as shown by step 20 in FIG. 1. The CVD silicon carbide coating is effective to provide a diffusion barrier against what is known (in) the art as auto doping, and improve high temperature properties of the component.

Alternatively, in place of siliconization, the porosity of the pore substrate may be reduced by a further infiltrating step with a material such as silicon carbide. Like the prior infiltrating step of the core, this may be carried out by chemical vapor infiltration. Accordingly, the infiltrant which is deposited in the open porous structure of the porous substrate may be formed of silicon, silicon carbide, or precursors of either of those materials, although other materials may be utilized as well. In this regard, the term "infiltrant" is used herein to denote the material actually deposited within the porous structure of the core and/or the porous substrate, while the actual infiltrating species is generally a precursor to that material. That is, as described above, the species which are used to carry out an infiltration procedure in the case of deposition of silicon carbide, include MTS and $H_2$ which together react to form silicon carbide, the infiltrant. Further, the reaction product of the reactants may actually form a deposited material which is a precursor material, such as an organic precursor of silicon or silicon carbide, which may be converted to the desired infiltrant, silicon and silicon carbide respectively, by later stage processing such as heat treatment. However, generally speaking, it is desirable to react directly the reactants to form the desired deposited material (infiltrant), rather than a precursor thereof.

Following the removal of the core, and optional porosity reduction, the resulting component may be used as-is for semiconductor processing. Alternatively, further process steps may be carried out to form the final semiconductor processing component. For example, multiple subcomponents may be formed following the techniques described herein, and assembled to form a complex shaped processing component. Alternatively, the subcomponents can be machined and joined in their porous state, and siliconization can be utilized to effect joining of the subcomponents. Alternatively, the as-formed component may be machined to its final dimensions.

Following completion of the semiconductor processing component, the component may be utilized in a semiconductor fabrication process. For example, in the case of a wafer boat, the boat may be loaded with a plurality of wafers, in either a horizontal or vertical configuration, and subjected to a semiconductor processing operation, such as annealing, deposition (for example, low pressure chemical vapor deposition, LPCVD), etching, polishing, or the like. In the case of a process tube, a component is loaded with a plurality of semiconductor wafers in a wafer boat, and subjected to desired process environment for forming semiconductor devices.

EXAMPLES

Several samples were prepared in accordance with various features of embodiments of the present invention. As shown below in Table 1, several commercially available raw materials were machined into test samples having variable overall dimensions, but typically 1"×1"×0.25" or smaller. As shown, Table 1 provides various characterization parameters of the core. Further, Table 2 provides characterization data of the core after being subjected to 100 hours of infiltration, namely chemical vapor infiltration of silicon carbide. In this regard, the chemical vapor infiltration was carried out in line with the process parameters described above as well as in U.S. Pat. No. 5,738,908. Infiltration was carried out at an $H_2$:MTS ratio of 7.5:1, a temperature of 1025° C., and a pressure of 50 torr

TABLE 1

| Sample # | Raw material before process | | | After 100 hours of CVI | | | | |
|---|---|---|---|---|---|---|---|---|
| | Catalog Pore size (μm) | Density | Porosity | coating on surfaces (micron) | open porosity after CVI | density after CVI | wt. gain (g) | wt. gain % |
| 2 | 200 | 0.05 | 97% | 55 | 55.56 | 1.32 | 1.3507 | 1718% |
| 4 | 25 | 0.39 | 78% | 53 | 11.49 | 2.24 | 1.4059 | 259% |
| 6 | 200 | 0.042 | 97% | 55 | 59.86 | 1.2 | 1.6374 | 1790% |
| 8 | 49 | 0.25 | 83% | 90 | 12.03 | 2.5 | 13.826 | 887% |
| 10 | 350 | 0.46 | 78% | 80 | 26.52 | 2.02 | 4.1668 | 356% |
| 12 | 119 | 1.05 | 55% | 100 | 10.71 | 2.21 | 10.3564 | 120% |
| 14 | 58 | 1.08 | 47% | 112 | 0.45 | 2.08 | 8.5966 | 86% |
| 16 | 33 | 1.1 | 48% | 135 | 0.23 | 2.08 | 8.7753 | 94% |
| 18 | 33 | 1.13 | 50% | 140 | 0.80 | 1.93 | 6.7112 | 87% |

Turning to Table 2, characterization of the samples after machining is summarized. The Samples were machined by grinding the CVD SiC coating off a minimum of one sample face. V-G is defined as the volume of graphite in the sample, V-P is the volume of the porosity in the sample, and V-SiC is the volume of silicon carbide in the sample.

TABLE 2

| S. # | Open porosity | Density | Wt. (g) | vol. (cm3) | est. graphite wt. | est. SiC wt. | est. (theoried) Density | V-g | V-p | V-SiC | Infiltration vol. (%) |
|---|---|---|---|---|---|---|---|---|---|---|---|
| 2 | 58% | 1.24 | 0.47 | 0.46 | 0.02 | 0.45 | 0.98 | 0.010359 | 0.45 | 0.1393179 | 31% |
| 4 | 25% | 1.85 | 0.74 | 0.35 | 0.14 | 0.60 | 1.72 | 0.062181 | 0.29 | 0.1879131 | 65% |
| 6 | 61% | 1.05 | 1.23 | 1.32 | 0.06 | 1.17 | 0.89 | 0.025225 | 1.30 | 0.3658897 | 28% |
| 8 | 18% | 2.31 | 6.89 | 2.91 | 1.34 | 5.55 | 1.91 | 0.60868 | 2.30 | 1.7292533 | 75% |
| 10 | 28% | 1.88 | 2.58 | 1.36 | 0.34 | 2.24 | 1.65 | 0.154188 | 1.20 | 0.6980645 | 58% |
| 12 | 13% | 2.13 | 9.06 | 4.26 | 4.47 | 4.59 | 1.08 | 2.032351 | 2.23 | 1.4295416 | 64% |
| 14 | 16% | 1.95 | 8.25 | 4.48 | 4.84 | 3.41 | 0.76 | 2.19891 | 2.28 | 1.0630523 | 47% |
| 16 | 15% | 1.99 | 8.87 | 4.24 | 4.66 | 4.21 | 0.99 | 2.118912 | 2.12 | 1.311026 | 62% |
| 18 | 24% | 1.81 | 6.4 | 3.56 | 4.03 | 2.37 | 0.67 | 1.830988 | 1.73 | 0.7388865 | 43% |

Further, following machining, the samples were subjected to heat treatment at a temperature of about 850° C. for 3 hours. This heat treatment was carried out in ambient air to oxidize the graphite core. A summary of the results are shown in Table 3. Compositional studies of the samples have revealed that the residual carbon content is within a range of about 10 to about 100 ppm, which represents the detection limit of the characterization equipment utilized for compositional study.

TABLE 3

| | | After oxidation | |
|---|---|---|---|
| S. # | Weight | Density | Open porosity |
| 2 | 0.2526 | 1.33 | 61.79 |
| 4 | 0.2852 | 1.58 | 58.22 |
| 6 | 0.8585 | 1.03 | 60.42 |
| 8 | 4.8198 | 2.13 | 32.31 |
| 10 | 1.3668 | 1.59 | 45.72 |
| 12 | 2.23 | 0.74 | 76.07 |
| 14 | 2.5504 | 0.84 | 73.01 |
| 16 | 2.7288 | 1.12 | 64.39 |
| 18 | 1.4637 | 0.64 | 80.01 |

Following core removal, the samples were subjected to siliconization by contacting the samples with a molten bath of semiconductor-grade silicon. Siliconization was carried out under vacuum at a pressure of about 1 torr, at a temperature of about 1850° C. The samples were subjected to a heating rate of 3° C./min, soaked at 1850° C. for one hour, and thereafter were allowed to cool naturally (free fall). After siliconization was completed, the siliconized samples were evaluated. It was found that samples 4, 8 and 10 exhibited nearly 100% dense SiC-Si bodies. In particular, sample 8 was measured to have a density of about 2.9 g/cm and sample 10 was measured to have a density of about 2.65 g/cm m. It is noted that the theoretical density of each sample varies based upon the relative contents of silicon carbide and silicon. In this regard, silicon carbide has a theoretical density of about 3.21 while silicon has a theoretical density of 2.33.

What is claimed is:

1. A method of forming a semiconductor processing component, comprising:
   providing a core comprised of a porous material;
   infiltrating the core with silicon carbide; and
   removing the porous material of the core, thereby forming a porous substrate comprising silicon carbide.

2. The method of claim 1, wherein the porous material of the core comprises carbon.

3. The method of claim 2, wherein the carbon has a total impurity content less than about 20 ppm.

4. The method of claim 2, wherein the carbon is in graphite form.

5. The method of claim 2, further comprising machining a portion of the core after infiltrating, to expose a portion of the core prior to removal of the porous material.

6. The method of claim 2, wherein carbon is removed by volatilization, leaving behind the porous substrate comprised mainly of silicon carbide.

7. The method of claim 6, wherein volatilization is carried out in an oxidizing environment.

8. The method of claim 7, wherein volatilization is carried out at a temperature of at least 600° C.

9. The method of claim 2, wherein the core is formed by machining a carbon blank.

10. The method of claim 1, wherein the infiltrating is carried out by chemical vapor infiltration.

11. The method of claim 10, wherein the core has a matrix defining interconnected network of pores, and infiltrating is carried out to deposit the silicon carbide in the network or pores by chemical vapor infiltration.

12. The method of claim 10, wherein chemical vapor infiltration is carried out by flowing gaseous reactants which react to form and deposit the silicon carbide.

13. The method of claim 12, wherein the reactants comprise a first reactant and a second reactant, the first reactant comprising methyltrichlorosilane (MTS), the methyltrichlorosilane providing a silicon source and a carbon source.

14. The method of claim 13, wherein the second mutant comprises hydrogen ($H_2$).

15. The method of claim 14, wherein the chemical vapor infiltration is carried out an $H_2$:MTS ratio of within a range of 1:1 to about 20:1.

16. The method of claim 10, wherein the chemical vapor infiltration is carried out a pressure within a range of 5 to 500 Torr.

17. The method of claim 10, wherein the chemical vapor infiltration is carried out a temperature within a range of 850 to 1200° C.

18. The method of claim 1, wherein the semiconductor processing component comprises at least one component from the group consisting of semiconductor wafer paddles, process tubes, wafer boats, liners, pedestals, long boats, cantilever rods, wafer carriers, vertical process chambers, and dummy wafers.

19. The method of claim 1, further comprising infiltrating the porous substrate with an infiltrant following removal of the porous material, to reduce porosity of the component.

20. The method of claim 19, wherein the infiltrant comprises at least one of silicon and silicon carbide, or a precursor of silicon or silicon carbide.

21. The method of claim 20, wherein the infiltrant comprises silicon.

22. The method of claim 21, wherein the component is infiltrated with silicon by contacting the component with liquid silicon at a temperature above a melting point of the silicon.

23. The method of claim 21, further comprising a step of depositing a layer of silicon carbide after infiltration with silicon.

24. The method of claim 23, wherein the silicon carbide is deposited by chemical vapor deposition.

25. The method of claim 20, wherein the infiltrant comprises silicon carbide.

26. A method of forming a component, comprising:
providing a porous core having an open porous structure of interconnected pores;
infiltrating the core such that an infiltrant penetrates the open porous structure and is deposited therein; and
removing the porous material of the core, thereby forming a porous substrate comprised mainly of aid infiltrant.

27. The method of claim 26, wherein the core is infiltrated with gaseous reactants which react to form and deposit said infiltrant.

28. The method of claim 27, wherein the reactants include a silicon source and a carbon source, and said material deposited in the open porous structure of the core comprises silicon carbide.

29. The method of claim 28, wherein the reactants comprise a first reactant and a second reactant, the first reactant comprising methyltrichlorosilane, the methyltrichlorosilane providing both the silicon source and the carbon source.

30. The method of claim 29, wherein the second reactant comprises hydrogen.

31. A method of forming a component, comprising:
providing a core comprised of a porous material;
infiltrating the core with a first infiltrant;
removing the porous material of the core, thereby forming a porous substrate comprised mainly of said first infiltrant;
infiltrating the porous substrate with a second infiltrant to reduce porosity of the porous substrate.

32. The method of claim 31, wherein the second infiltrant is selected from the group consisting silicon, silicon carbide, and precursors thereof.

33. A method of processing a semiconductor wafer, comprising:
providing a semiconductor processing component formed by infiltrating silicon carbide into a core formed of a porous material, removing the porous material of the core to form a porous substrate, and infiltrant the porous substrate with at least one of silicon and silicon carbide to reduce a porosity of the porous substrate; and
subjecting at least one semiconductor wafer to a processing operation utilizing the semiconductor processing component.

34. A method of forming a component, comprising:
providing a substrate assembly having a porous core which forms a matrix defining internal passageways, and an infiltrant material coating the internal passageways of the core; and
removing the core leaving behind a porous substrate comprising the infiltrant material.

35. The method of claim 34, further comprising a step of reducing a porosity of the porous substrate.

* * * * *

UNITED STATES PATENT AND TRADEMARK OFFICE
CERTIFICATE OF CORRECTION

PATENT NO. : 6,881,262 B1
DATED : April 19, 2005
INVENTOR(S) : Andrew G. Haerle et al.

It is certified that error appears in the above-identified patent and that said Letters Patent is hereby corrected as shown below:

Column 9,
Line 20, delete "mutant" and insert therefore -- reactant --.

Column 10,
Line 38, delete "infiltrant" and insert therefore -- infiltrating --.

Signed and Sealed this

Fifth Day of July, 2005

JON W. DUDAS
*Director of the United States Patent and Trademark Office*